(12) United States Patent
Kaneko et al.

(10) Patent No.: US 6,252,221 B1
(45) Date of Patent: Jun. 26, 2001

(54) PHOTO-CONDUCTIVE SWITCH HAVING AN IMPROVED SEMICONDUCTOR STRUCTURE

(75) Inventors: Yasuhisa Kaneko; Mitsuchika Saito, both of Kawasaki Kanagawa (JP); Thomas S. Low, Sebastopol, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/337,045

(22) Filed: Jun. 21, 1999

(51) Int. Cl.$^7$ .................................................. H01J 40/14

(52) U.S. Cl. .............................. 250/214 LS; 250/214 LA

(58) Field of Search ...................... 250/214 LS, 214 LA, 250/214 SW, 214.1, 214 R; 257/117, 113, 114, 184, 188

(56) References Cited

U.S. PATENT DOCUMENTS 4,032,945 * 6/1977 Mori et al. ............................ 257/188

* cited by examiner

Primary Examiner—Que T. Le
(74) Attorney, Agent, or Firm—Ian Hardcastle

(57) ABSTRACT

A PCS that comprises a photo-conductive layer of NB material sandwiched between a top confinement layer and a bottom confinement layer. Both confinement layers are layers of WB material. NB material and WB material are semiconductor materials. NB material has a smaller band-gap energy than WB material. The top confinement layer and the photo-conductive layer have opposite conductivity types. A first electrode and a second electrode, separated from each other by a gap and are located on the surface of the top confinement layer remote from the photo-conductive layer. The photo-conductive layer provides a low-resistance conduction path between the electrodes when the photo-conductive layer is illuminated with incident light of an appropriate wavelength and intensity.

24 Claims, 10 Drawing Sheets

PHOTO-CONDUCTIVE SWITCH HAVING AN IMPROVED SEMICONDUCTOR STRUCTURE

FIELD OF THE INVENTION

The invention relates generally to photo-electronic devices, and more particularly to a high performance photo-conductive switch that can be fabricated at a low cost.

BACKGROUND OF THE INVENTION

Microwave switches are being expected to perform at higher frequencies, with an improved ON to OFF ratio, a reduced insertion loss and increased isolation. A photo-conductive switch (PCS) uses light to control its electronic conductivity and therefore to modulate electronic signals passing through it. A photo-conductive switch has less stray electronic impedance than an equivalent electronically-controlled switch such as a transistor. Consequently, photo-conductive switches are potentially better suited for use as high-frequency and high-performance microwave switches.

U.S. Pat. No. 3,917,943 to Auston discloses a first type of PCS that is driven by an ultra-short optical pulse and is fabricated on a semiconductor substrate. Two gold micro-strip transmission lines separated by a narrow gap are located on the surface of a light-absorbing insulating semiconductor substrate. A first optical pulse directed to the substrate through the gap turns the PCS ON by generating copious electric charges on the substrate surface in the gap. A second optical pulse that begins during the first optical pulse and is directed to the gap generates copious electric charges in the bulk of the substrate extending down to the ground plane. This shorts the micro-strip transmission lines to ground, and switches the PCS OFF. The substrate is grown at a low temperature or is ion implanted to shorten the carrier lifetime to provide a very fast response. However, this also reduces the carrier mobility, which causes the PCS to have a high insertion loss.

U.S. Pat. No. 4,755,663 to Derkits, Jr. indicates that a disadvantage of the Auston PCS is that the electrical impulse created by the optical pulse is dominated by carrier recombination, rather than carrier transport. Derkits discloses a PCS in which the portion of the substrate constituting the gap includes a region composed of a textured-surface, graded-composition photosensitive semiconductor material. Illuminating the gap with a beam of light of sufficient intensity to generate charge carriers at the surface of the photosensitive semiconductor material causes the PCS to conduct.

FIG. 1 shows an embodiment of the PCS 1 disclosed by Derkits, Jr. In this, the semi-insulating semiconductor substrate 10, preferably of silicon, has the ground plane electrode 11 or an ohmic contact located on its major surface 21. On the opposite major surface 22 of the substrate is located the layer 18 of a wide band-gap energy semiconductor material. Overlaying the layer 18 is the layer 19 of a graded-composition alloy semiconductor material. Located on surface of the layer 19 and extending over part of the major surface 22 of the substrate are the electrodes 14 and 15 separated by the gap 13. The electrodes form the ohmic contact regions 17 with the layer 19.

The material of the layer 19 is an alloy of two semiconductor materials W and N. Semiconductor material W has a wide band-gap energy and semiconductor material N has a narrow band-gap energy. The fraction of the narrow band-gap energy semiconductor material N in the alloy increases monotonically with increasing distance from the layer 18 from a value of zero at the junction with the layer 18. The grooves 20 or other texturing are formed in the part of the layer 19 underlying the gap 13 to serve as charge separators.

Light falling on the layer 19 through the gap 13 creates charge carriers that provide electrical conduction between the electrodes 14 and 15. Extinguishing the light turns the PCS OFF by generating a quasi-electric field that sweeps the charge carriers into the region of the layer 19 where the narrow band-gap energy material is predominant. In this region, the grooves 20 separate the charge carriers and prevent further conduction between the electrode segments.

While the PCS disclosed by Derkits offers improved performance, PCSs with further performance improvements are required to meet the requirements of present-day technology.

SUMMARY OF THE INVENTION

The invention provides a photo-conductive switch (PCS) that has a lower insertion loss and provides greater isolation than a conventional PCS. The insertion loss is reduced as a result of the PCS according to the invention having a smaller ON resistance $R_{on}$. The isolation is increased as a result of the PCS according to the invention having a smaller OFF capacitance $C_{off}$. Thus, the PCS according to the invention has a smaller figure of merit $F=R_{on} \times C_{off}$ than a conventional PCS. A smaller figure of merit indicates a PCS with better performance.

The PCS according to the invention is based on a multi-layer semiconductor structure that includes multiple heterojunctions. Each of the heterojunctions is a junction between a layer of a semiconductor material having a wider band-gap energy (WB material) and a layer of a semiconductor material having a narrower band-gap energy (NB material). The semiconductor materials forming one of the heterojunctions are doped so that they have opposite conductivity types. Thus, this heterojunction is formed between a layer of p-type WB material and a layer of n-type NB material, or between a layer of n-type WB material and a layer of p-type NB material.

The PCS according to the invention comprises a three-layer semiconductor structure composed of a photo-conductive layer of NB material sandwiched between a top confinement layer and a bottom confinement layer. Both confinement layers are layers of WB material. The top confinement layer and the photo-conductive layer have opposite conductivity types. A first electrode and a second electrode, separated from each other by a gap, are located on the surface of the top confinement layer remote from the photo-conductive layer. The photo-conductive layer provides a conduction path between the electrodes when the photo-conductive layer is illuminated with incident light of an appropriate wavelength and intensity.

Preferably, the conductivity type of the photo-conductive layer is p-type and that of the top confinement layer is n-type since this combination of conductivity types provides a higher conductivity than the opposite combination.

The double heterojunction PCS structure just described prevents charge carriers from diffusing in a direction perpendicular to the plane of the layers and enhances the efficiency with which charge carriers are generated in response to the incident light. This results in a lower ON resistance $R_{on}$, and, hence, a lower insertion loss.

The double heterojunction PCS structure just described also provides a lower OFF capacitance $C_{off}$, which increases the isolation provided by the PCS according to the invention in its OFF state.

The PCS according to the invention may additionally comprise a graded-composition layer or a chirped superlattice located between the photo-conductive layer and the top confinement layer to reduce the ON resistance $R_{on}$.

The PCS according to the invention may additionally comprise a mirror layer located to reflect incident light that passes through the photo-conductive layer back into the photo-conductive layer to reduce further the ON resistance $R_{on}$.

The electrodes of the PCS according to the invention may additionally include a translucent conductive material to reduce further the ON resistance $R_{on}$.

The PCS according to the invention may additionally comprise a substrate of a substrate material that is translucent in the range of wavelengths of the incident light that are absorbed by the photo-conductive layer. The substrate supports at least the photo-conductive layer and the top confinement layer. The incident light passes through the translucent substrate to illuminate the photo-conductive layer. Since the incident light is not partially obstructed by the electrodes, the ON resistance $R_{on}$ is reduced.

The PCS according to the invention may alternatively comprise an opaque substrate that supports the double heterojunction PCS structure, and the substrate may define a through-hole that admits the incident light to illuminate the photo-conductive layer. Since the incident light is not partially obstructed by the electrodes, the ON resistance $R_{on}$ is also reduced.

DETAILED DESCRIPTION OF THE INVENTION

The invention is based on the inventors recognizing the following four problems associated with prior-art PCSs and generating effective solutions to these problems.

1. Prior-art PCSs are constructed from materials grown at a low temperature and therefore have a high insertion loss because of the low carrier mobility of such materials.

2. The structure of prior-art PCSs does not allow the carriers generated in response to the incident light to contribute efficiently to conduction between the electrodes. For example, prior-art PCSs lack a structure that confines the carriers generated in response to the incident light to a specific location. Instead, the structure of prior-art PCSs allows the carriers to diffuse away from where they are formed so that fewer carriers are available to provide conduction between the electrodes.

3. In prior-art PCSs, a portion of the carriers generated in response to the incident light reaches the electrodes, where recombination takes place. This recombination results in regions of a low carrier density, where the resistivity is higher. This results in a high ON resistance $R_{on}$. High resistance regions are also found in n-i-n devices.

4. Dangling bonds at the surfaces of the semiconductor layers in prior-art PCSs form traps where the carriers generated in response to the incident light can recombine. This reduces the efficiency with which carriers are generated in response to the incident light.

Figure 1:
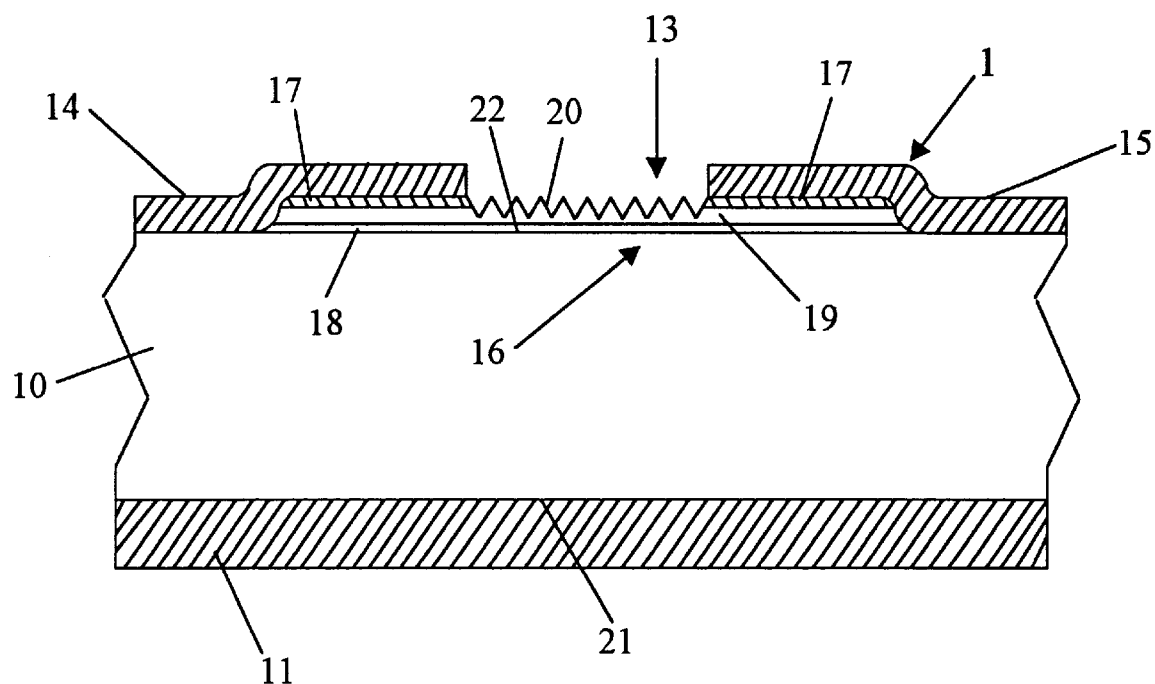
FIG. 1 is a cross sectional view of a prior-art photo-conductive switch (PCS).
Figure 2:
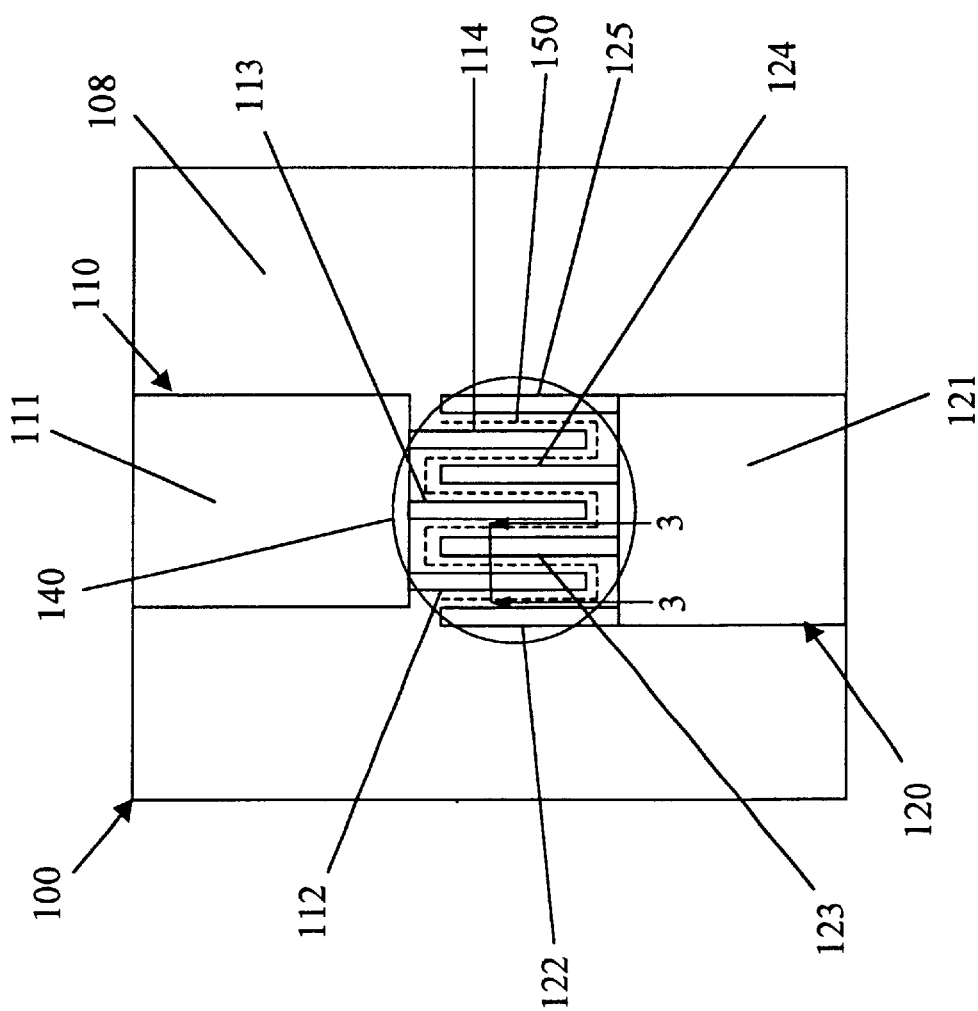
FIG. 2 is a plan view of a first embodiment of a PCS according to the invention in its conducting state.
Figure 3:
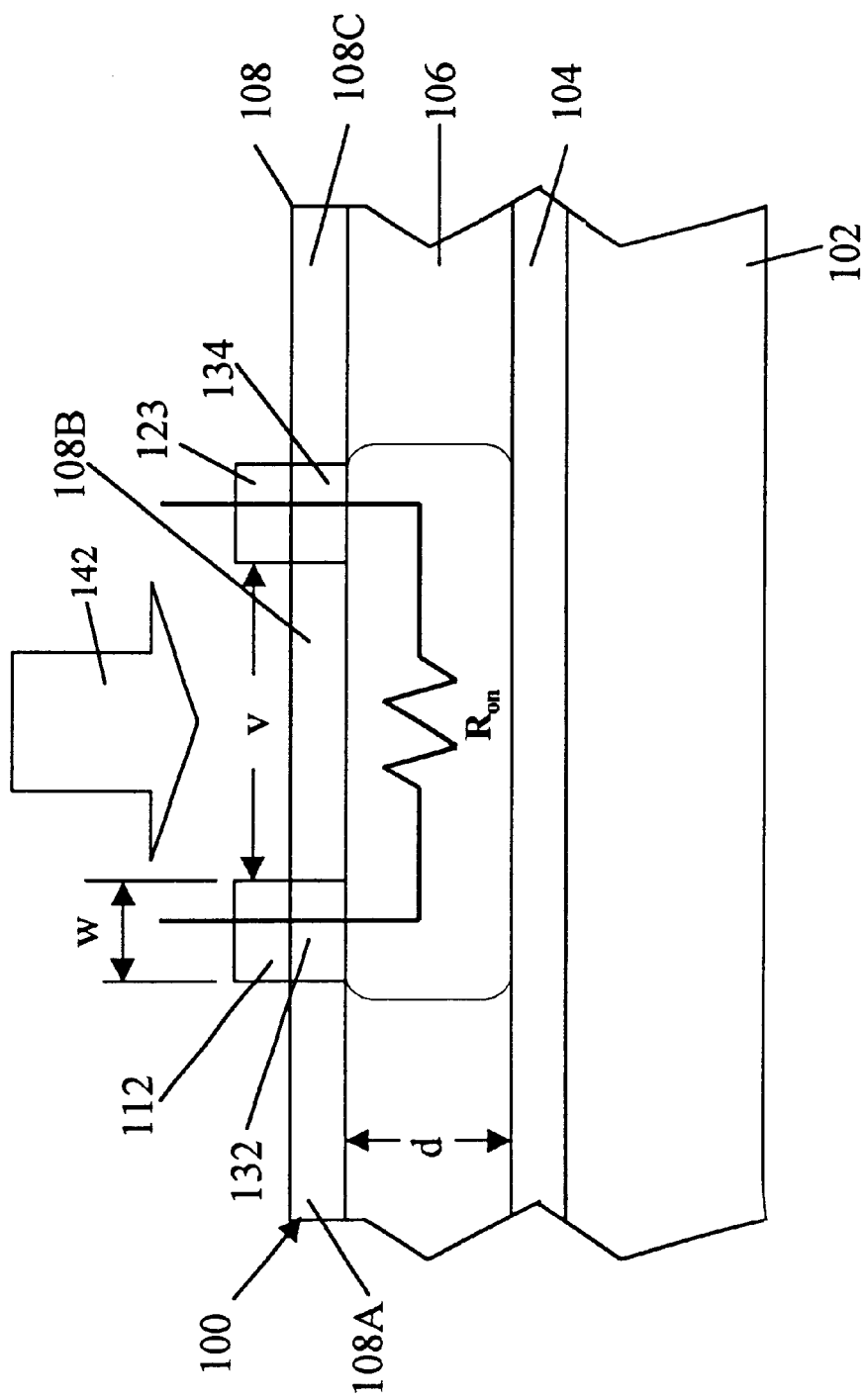
FIG. 3 is a cross-sectional view of the PCS according to the invention taken along the line 3—3 in FIG. 2.

FIG. 2 and FIG. 3 illustrate a first, basic embodiment 100 of a PCS according to the invention. The PCS 100 is composed of the bottom confinement layer 104 of WB material, i.e., a semiconductor material having a wide band-gap energy; the photo-conductive layer 106 of NB material, i.e., a semiconductor material having a narrow band-gap energy; and the top confinement layer 108 of WB material. The photo-conductive layer is sandwiched between the bottom confinement layer and the top confinement layer. Located on the exposed surface of the top confinement layer 108 are the terminals 110 and 120. The terminal 110 is composed of the electrodes 112, 113 and 114 coupled to the bonding pad 111. The terminal 120 is composed of the electrodes 122, 123, 124 and 125 coupled to the bonding pad 121. The electrodes of the terminal 110 are separated from the electrodes of the terminal 120 by a narrow gap.

The bottom confinement layer 104 is shown in FIG. 3 as a layer of WB material grown or deposited on the semiconductor substrate 102. This enables commonly-available, low-cost semiconductor materials to be used for the substrate. Such materials are not usually WB materials. However, if the semiconductor material of the substrate is a WB material, such as InP, the bottom confinement layer may be integral with the substrate, and no separate bottom confinement layer is necessary. The photo-conductive layer 106 and the top confinement layer 108 are successively grown or deposited on the bottom confinement layer.

The conductivity type of the WB material of the top confinement layer 108 is opposite to that of the NB material of the photo-conductive layer 106. Preferably, the conductivity of the WB material of the top confinement layer is n-type and that of the NB material of the photo-conductive layer 106 is p-type, although the conductivity types of the WB and NB materials may be reversed.

The WB material of the bottom confinement layer 104 may be the same as the WB material of the top confinement layer 108. Alternatively, different WB materials may be used for the top and bottom confinement layers. The conductivity type of the WB material of the bottom confinement layer may be of the same as that of the photo-conductive layer 106, or may be the opposite of that of the photo-conductive layer, or the WB material of the bottom confinement layer may be undoped.

Absent the top confinement layer 108, dangling bonds would exist at the surface of the photo-conductive layer 106. Such dangling bonds create surface states that trap the carriers generated in response to the incident light 142 and promote recombination of the carriers. In the PCS 100, the top confinement layer 108 covers the surface of the photo-conductive layer and substantially reduces the number of dangling bonds present at the surface of the photo-conductive layer. Thus, the top confinement layer increases the number of carriers extant in the photo-conductive layer in response to a given intensity of the incident light.

Only those portions of the top confinement layer 108, such as the portions 132 and 134 shown in FIG. 3, that are covered by the terminals 110 and 120 function as a confinement layer. FIG. 3 also shows the portions 108A, 108B and 108C of the top confinement layer that are not covered by the electrodes 112 and 123. The top surface of the portions 108A, 108B and 108C of the top confinement layer has a surface state energy that is strongly pinned at several times the thermal energy (kT, where k is Boltzmann's constant and T is the absolute temperature) in the band gap of the WB material. As a result, these portions are depleted through the entire thickness of the top confinement layer.

When the portions 108A–108C of the top confinement layer 108 are depleted through the thickness of the layer, no conduction path exists in the top confinement layer between the terminals 110 and 120. Moreover, in the absence of incident light, the two back-to-back p-n junctions that exist between the top confinement layer and the photo-conductive layer 106 block conduction between the terminals through the photo-conductive layer 106. Conduction between the terminals occurs only when the PCS 100 is illuminated with the incident light 142, which causes carriers to be generated in the photo-conductive layer.

The electrodes 112–114 forming part of the terminal 110 are interdigitated with the electrodes 122–125 forming part of the terminal 120. The shape and location of the electrodes are preferably optimized to minimize the ON resistance $R_{on}$ between the terminals 110 and 120 when the PCS 100 is illuminated by the incident light 142. FIG. 2 shows at 140 the substantially circular area on the top surface of the PCS 100 that is illuminated by the incident light 142. The beam of incident light is shaped so that the area 140 covers most of the region where the electrodes are interdigitated.

When conventional opaque metal electrodes are used as the electrodes 112–114 and 122–125, the electrodes reflect or absorb the fraction of the incident light 142 that illuminates the electrodes. This fraction of the incident light does not reach the photo-conductive layer 106 and generate carriers. In cases in which the area of the area 140 is limited, a trade off may be made between the fraction of the area 140 that is covered by the electrodes, and the remainder of the area 140 through which the incident light 142 can reach the photo-conductive layer 106 and generate carriers.

The preferred characteristics of the confinement layers 104 and 108 are as follows:

The band-gap energies of the WB materials of the confinement layers 104 and 108 should preferably be more than 25 meV greater than the band-gap energy of the NB material of the photo-conductive layer 106 to prevent the carriers generated in the photo-conductive layer in response to the incident light 142 from diffusing into the confinement layers. The band-gap energy difference of 25 meV corresponds to thermal energy at room temperature.

The confinement layer through which the incident light reaches the photo-conductive layer 106, e.g., the top confinement layer 108 in the embodiment shown in FIGS. 2 and 3, should be as thin as possible and the WB material of the confinement layer should be highly transparent at the wavelength of the incident light 142 to maximize the transmission of the incident light through the confinement layer to the photo-conductive layer 106. In other words, the product of the thickness $t_c$ of the confinement layer and the absorption coefficient $\alpha_c$ of the WB material of the confinement layer should be significantly smaller than unity., i.e., $t_c \alpha_c < 1$. Tunnelling effects set a practical limit to the minimum thickness of the confinement layer. Consequently, the absorption coefficient of the confinement layer through which the incident light reaches the photo-conductive layer is preferably less than 100 cm$^{-1}$.

The WB material of the top confinement layer 108 should have a high electron mobility to provide a high conductivity. A high conductivity reduces the resistance of the conduction paths through the top confinement layer 108 from the electrodes 112–114 and 122–125 to the photo-conductive layer 106.

The WB material of the top confinement layer 108 should have a high doping concentration to provide the top confinement layer with a high conductivity. However, too high a doping concentration would prevent the top confinement layer of a given thickness from being fully depleted. Reducing the thickness of the top confinement layer to enable the layer to be fully depleted increases tunnelling effects. Thus, the optimum doping concentration of the WB material of the top confinement layer involves a trade-off between these conflicting requirements. A doping concentration of the order of $1 \times 10^{17}$ cm$^{-3}$ is an acceptable compromise. The preferred characteristics of the photo-conductive layer 106 are as follows:

The photo-conductive layer 106 should be as thick as can be practically fabricated, and the NB material of the photo-conductive layer should have as high an absorption coefficient as possible at the wavelength of the incident light 142. These characteristics enable the photo-conductive layer to absorb as much of the incident light 142 as possible, and therefore generate as many carriers as possible in response to the incident light. In other words, the product of the thickness d of the photo-conductive layer and the absorption coefficient $\alpha_P$ of the NB material of the photo-conductive layer at the wavelength of the incident light should be greater than about unity, i.e., $d\alpha_P > \sim 1$. Process limitations on the maximum thickness of photo-conductive layer make it desirable for the absorption coefficient of the NB material of the photo-conductive layer to be greater than 1000 cm$^{-1}$ at the wavelength of the incident light. The wavelength of the incident light should be chosen so that the photon energy of the incident light is greater than the band edge energy of the NB material of the photo-conductive layer to maximize the absorption coefficient.

The NB material of the photo-conductive layer 106 should have a high carrier mobility to provide the photo-conductive layer 106 with a high conductivity. A high conductivity reduces the resistance of the photo-conductive layer to reduce the ON resistance $R_{on}$.

The lifetime of carriers in the NB material of the photo-conductive layer 106 should be long so that the carriers can contribute to transmission of the signal through the PCS 100.

The NB material of the photo-conductive layer 106 should have a doping concentration of less than $1 \times 10^{17}$ cm$^{-3}$ to reduce the OFF capacitance $C_{off}$.

The properties of the NB material of the photo-conductive layer 106 determine the lifetime of the carriers generated in response to the incident light 142. As noted above, it is generally desirable to increase the lifetime of the carriers. However, too long a carrier lifetime impairs the switching speed of the PCS. Consequently, the carrier lifetime should be shorter than the desired switching time of the PCS 100. Otherwise, the carriers generated in response to the incident light will continue to exist a significant time after the incident light 142 ceases to illuminate the PCS 100. The remaining carriers increase the conductance of the PCS in its OFF state, which decreases the isolation provided by the PCS in its OFF state. In many applications, a switching time of about 1 ms is acceptable. Even NB materials, such as silicon, that have extremely long carrier lifetimes can easily provide such a switching speed. NB materials such as GaAs can be used when higher switching speeds are required.

Illuminating the PCS 100 with the incident light 142 sets the PCS to its ON state. The PCS 100 is most commonly used in RF and microwave systems, which typically have a characteristic impedance of 50Ω. The ON resistance $R_{on}$ of a PCS for use in systems with a 50Ω characteristic impedance is acceptably small if it is small compared with 50Ω, i.e., $R_{on}$<50Ω. Thus, for a given intensity of the incident light 142 in such PCSs, measures that decrease the ON resistance to a level that is small compared with 50Ω provide a useful improvement in the performance of the PCS. However, measures that, for the same intensity of the incident light, reduce the ON resistance below the level that is small compared with 50Ω have a negligible effect on the performance of the PCS. Nevertheless, such measures are worth implementing because they enable the ON resistance to be small compared with 50Ω at a lower intensity of the incident light. This enables the incident light to be generated using a simpler, lower-cost light source that generates less heat. Such a light source generally has improved lifetime and reliability, and consumes less power. Thus, the measures to be described below for reducing the ON resistance $R_{on}$ of the PCS 100 can additionally or alternatively be used to reduce the intensity of the incident light at which the ON resistance is small compared with 50Ω.

In the ON state of the PCS 100, as shown in FIG. 3, the ON resistance $R_{on}$ of the PCS is determined by the following equations:

$$R_{on} = R_{s(on)} + R_c$$

where:

$$R_{s(on)} = \frac{1}{q \cdot \mu \cdot n} \cdot \frac{w + v + d}{l \cdot d} \text{ and}$$

$$n = \int_0^d \left( A \cdot e^{-x/\sqrt{D \cdot \tau}} + B \cdot e^{-x/\sqrt{D \cdot \tau}} + \frac{\alpha_p \cdot w \cdot l \cdot P}{h\nu \cdot D \cdot ((\alpha_p \cdot D \cdot \tau)^2 - 1)} \cdot e^{-\alpha_p \cdot x} \right) dx$$

in which:

$R_{on}$ is the ON resistance of the PCS measured between the terminals 110 and 120, $R_{s(on)}$ is the semiconductor path ON resistance, i.e., the resistance of the conduction path through the top confinement layer 108 and the photo-conductive layer 106, $R_c$ is the resistance of the contacts between the terminals 110 and 120 and the top confinement layer 108, q is the unit charge, μ is the carrier mobility, n is the population of carriers generated in response to the incident light 142, w is the width of the electrodes, v is the distance between the electrodes, l is the length of the perimeter of the electrodes subject to irradiation by the incident light, as indicated by the broken line 150 in FIG. 2, d is the thickness of the photo-conductive layer 106, h is Planck's constant, ν is the frequency of the incident light, τ is the carrier lifetime, D is the diffusion constant of the carriers, P is the intensity of the incident light, $\alpha_P$ is the optical absorption coefficient of the photo-conductive layer, and A and B are constants.

From the above equation, it can be seen that increasing P, the intensity of the incident light, and selecting semiconductor materials that have higher values of the carrier mobility μ, the carrier lifetime τ and the optical absorption coefficient $\alpha_P$ reduces the ON resistance $R_{on}$. The optical absorption coefficient $\alpha_P$ increases as the frequency ν of the incident light increases, so it is preferable to employ incident light having a short wavelength. A lens is preferably used to focus the incident light into a small volume of the photo-conductive layer 106 to increase the intensity P. This is especially useful in embodiments of the PCS for use at higher frequencies in which the dimensions of the PCS should be small.

To reduce the ON resistance $R_{on}$, the incident light 142 should be converted to carriers with a high overall conversion efficiency. The overall conversion efficiency η is given by:

$$\eta\ (\%) = \eta_c \times \eta_s \times \eta_r \times \eta_a \times \eta_i$$

in which:

$\eta_c$ is the coupling efficiency determining the fraction of the incident light 142 actually received by the light reception area 140 of the PCS 100 (95% in this embodiment), $\eta_s$ is the electrode transmission factor, i.e., the fraction of the incident light not absorbed or reflected by the electrodes 112–114 and 122–125. In the PCS 100, the electrode transmission factor is approximately equal to the fraction of the light reception area 140 not covered by the electrodes, $\eta_r$ is the fraction of the incident light transmitted through the confinement layer to the photo-conductive layer 106, $\eta_a$ is the absorptance the photo-conductive layer 106, and $\eta_i$ is the internal quantum efficiency with which the photo-conductive layer converts light into carriers.

Figure 4:
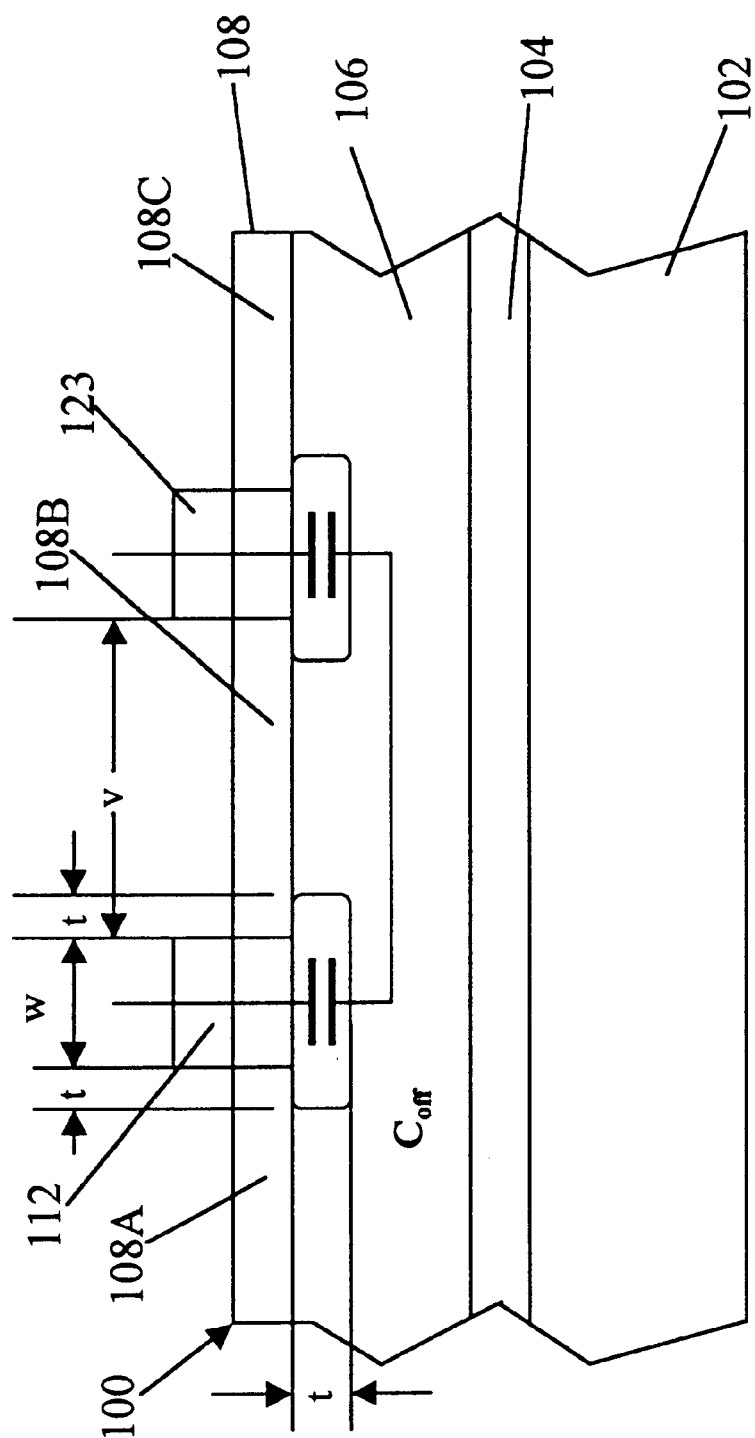
FIG. 4 is a cross-sectional view of part of the first embodiment of the PCS according to the invention in its non-conducting state.

FIG. 4 shows the PCS 100 in its OFF state in the absence of the incident light 142. The impedance of the PCS in its OFF state is the impedance of the parallel combination of the ohmic resistance of the PCS in its OFF state and the reactance $1/2\ \pi f \cdot C_{off}$ of the OFF capacitance $C_{off}$, where f is the frequency of the signal being switched by the PCS. As noted above, the PCS according to the invention is most commonly used in RF and microwave systems, which typically have a characteristic impedance of 50Ω. At RF and microwave frequencies, the dominant element in determining the impedance of the parallel combination is the reactance of the OFF capacitance $C_{off}$. The OFF capacitance $C_{off}$ of a PCS for use in a system with a characteristic impedance of 50Ω is acceptably low if its reactance is large compared with 50Ω, i.e., $1/2\pi f \cdot C_{off}$>50Ω.

In PCSs for use in applications having a characteristic impedance of 50Ω, measures that decrease the OFF capacitance $C_{off}$ to one having a reactance at a given frequency that is large compared with 50Ω provide a useful improvement in the performance of the PCS. However, measures that further decrease the OFF capacitance have a negligible effect on the performance of the PCS. Nevertheless, such measures are worth pursuing because they enable the OFF capacitance to have a reactance that is large compared with 50Ω at yet higher frequencies. This extends the range of applications in which the PCS according to the invention can be used. Thus, the measures to be described below for reducing the OFF capacitance $C_{off}$ can additionally or alternatively be used to provide an OFF capacitance that has a reactance that is large compared with 50Ω at higher operating frequencies.

The main contributors to the OFF capacitance $C_{off}$ are (1) the capacitance of the depletion layer between the photo-conductive layer 106 and the top confinement layer 108, (2) the capacitance of the depletion layer created by dangling bonds in the top confinement layer 108, and (3) the capacitance of the depletion layer between the photo-conductive layer 106 and the bottom confinement layer 104. Of these, the capacitance of the depletion layer between the photo-conductive layer 106 and the top confinement layer 108 predominates, and the OFF capacitance $C_{off}$ can be approximately determined using the equation:

$$C_{off} = \frac{\varepsilon \cdot l \cdot (w + 2t)}{2t} \text{ where:}$$

$$t = \sqrt{\frac{2 \cdot \varepsilon_n \cdot \varepsilon_p \cdot (\Phi_i - V)}{q} \cdot \frac{p}{n(p\varepsilon_p + n\varepsilon_n)}}$$

in which:

t is the thickness of the depletion layer, $\varepsilon_n$ is the permittivity of the confinement layer, $\varepsilon_P$ is the permittivity of the photo-conductive layer, l is the length of the perimeter of the electrodes, as indicated by the broken line 150 in FIG. 2 w is the width of the electrodes, n and p are the dopant concentrations of the top confinement layer 108 and the photo-conductive layer 106 respectively, $\Phi_i$ is the built-in potential, and V is an applied voltage (V=0 in this example).

It can be seen that reducing the dopant concentration p in the photo-conductive layer 106 reduces the OFF capacitance $C_{off}$. However, the minimum dopant concentration is subject to practical limitations, as will be discussed below.

The above equations enable the design of the PCS 100 to be optimized to obtain a small figure of merit $R_{on} \times C_{off}$. This figure of merit is one important measure for a high performance PCS.

Examples of combinations of materials that can be used for the substrate, the confinement layers and the photo-conductive layer in the PCSs disclosed in this disclosure are shown in Table 1. The materials of the photo-conductive layer 106 and at least the top confinement layer 108 are doped with appropriate dopants to define their conductivity types.

As noted above, the bottom confinement layer 104 and the top confinement layer 108 can be layers of different materials. In such event, the material of the top confinement layer is listed in Table 1.

One advantage of the combinations of materials listed in Table 1 is that they minimize the lattice mismatch between adjacent layers and therefore have a longer carrier lifetime than combinations having a larger lattice mismatch.

TABLE 1

| | Substrate | Confinement layers | Photo-conductive layer |
|---|---|---|---|
| 1 | GaAs | $Al_yGa_{1-y}As$ (0.02 < y < 1.0) | $Al_xGa_{1-x}As$ (x < y) |
| 2 | GaAs | $(Al_yGa_{1-y})_{0.5}In_{0.5}P$ (0.0 ≦ y ≦ 1.0) | $Al_xGa_{1-x}$ (0.0 ≦ x < 0.5) |
| 3 | GaAs | $Al_yGa_{1-y}As$ (0.0 < y < 1.0) | $In_xGa_{1-x}As$ (0.01 < x < 0.3) |
| 4 | InP | $(Al_xGa_{1-x})_{0.5}In_{0.5}As$ (0.01 < x < 1.0) | $In_{0.5}Ga_{0.5}As$ |
| 5 | InP | $(Al_xGa_{1-x})_{0.5}In_{0.5}As$ (0.01 < x < 1.0) | $GaAs_{0.5}Sb_{0.5}$ |
| 6 | SiC or $Al_2O_3$ | $Al_xGa_{1-x}N$ (0.01 < x < 1.0) | GaN |
| 7 | Si | Si | $Ge_xSi_{1-x}$ (0.05 < x < 1.0) |
| 8 | Si or SiC | SiC | Si |
| 9 | GaAs or ZnSe | $Zn_yMg_{1-y}S_zSe_{1-z}$ (0.0 < y < 1.0 and 0.0 < z < 1.0) | $ZnS_xSe_{1-x}$ (0.0 < x < 1.0) |
| 10 | GaSb | $Al_xGa_{1-x}Sb$ (0.01 < x < 1.0) | GaSb |
| 11 | PbTe | $Pb_xCd_{1-x}Te$ (0.01 < x < 1.0) | PbTe |

Of the above combinations, combinations 1–4 and 7 are favored because they have a high electron mobility and long carrier lifetimes and can be made using available mature epitaxial growth and process technologies.

The substrate material in combinations 4 and 5 is InP, which is a WB material. In PCSs fabricated using combination 4 or combination 5, the lower confinement layer 104 can be integral with the substrate 102, and the photo-conductive layer 106 can be deposited directly on the surface of the substrate. Also, the substrate material in combination 7 is silicon, which is a WB material. In a PCS with a silicon substrate, the lower confinement layer can be integral with the substrate, and the photo-conductive layer can be deposited directly on the surface of the substrate.

The incident light 142 may be generated using any suitable light source. A miniature light source such as a semiconductor light-emitting device is preferred. A semiconductor laser is most preferred for use in PCSs for switching microwave signals with switching speeds in the microsecond range. Semiconductor lasers are small in size, operate at a speed high enough to obtain the desired switching speeds and are low in cost. Semiconductor lasers are available that can emit light in the wavelength range from 0.40 to 1.55 μm. Most of the above combinations will operate in response to a laser generating light in this wavelength range. For a given combination of materials, the wavelength of the incident light must lie in the range of wavelengths that is transmitted by the material of the confinement layer through which the light passes to the photo-conductive layer and that is absorbed by the material of the photo-conductive layer.

The ON resistance of the PCS 100 just described can be further reduced by locating a graded-composition layer or a chirped super lattice multi-layered film at the heterojunction between the top confinement layer 108 and the photo-conductive layer 106. The band-gap energy of the graded composition layer changes progressively through the thickness of the layer, while that of the chirped super-lattice multi-layered film changes in steps through the thickness of the film to simulate the effect of a continuously graded-composition layer.

A second embodiment 200 of a PCS according to the invention will now be described with reference to FIG. 5.

The PCS 200 is composed of the undoped, 70 nm-thick $Al_{0.3}Ga_{0.7}As$ bottom confinement layer 204, the p-type GaAs photo-conductive layer 206 (1.70 μm thick and doped at p=2×10$^{16}$ cm$^{-3}$) and the n-type Al$_{0.23}$Ga$_{0.77}$As top confinement layer 208 (70 nm thick and doped at n=3×10$^{17}$ cm$^{-3}$). These layers are successively grown on the semi-insulating GaAs substrate 202 using molecular-beam epitaxy (MBE) or another suitable epitaxial growth technique. The confinement layers may have composition ratios different from those just described. However, the aluminum fraction in the top confinement layer 208 should preferably be less than 0.25. If the aluminum fraction in the top confinement layer exceeds 0.25, the density of deep levels or DX centers in the top confinement layer drastically increases, as described by M. Tachikawa et al., 23 Jpn. J. Appl. Phys., 1594 (1984). The DX centers dramatically reduce the free electron concentration in the top confinement layer, which significantly increases the ON resistance R$_{on}$.

The graded-composition layers 207 and 250 formed of n-type semiconductor material doped at n=3×10$^{17}$ cm$^{-3}$, i.e., the same doping concentration as the top confinement layer 208, are epitaxially grown before and after, respectively, the top confinement layer 208 is grown.

The graded-composition layer 207 is 30 nm thick and composed of n-type Al$_x$Ga$_{1-x}$As in which the value of the aluminum fraction x progressively increases from zero at the photo-conductive layer 206 to 0.23 at the top confinement layer 208.

Similarly, the graded-composition layer 250 is 30 nm thick and is composed of n-type Al$_x$Ga$_{1-x}$As in which the value of the aluminum fraction x progressively decreases from 0.23 at the top confinement layer 208 to zero at the GaAs cap layer 252.

The n-type GaAs cap layer 252, which has a thickness of 200 nm and is doped at n=5×10$^{18}$ cm$^{-3}$, is grown on the graded-composition layer 250. The n-type In$_{0.5}$Ga$_{0.5}$As contact layer 254, which is 20 nm thick and is heavily doped at n=2×10$^{19}$ cm$^{-3}$, is grown on the cap layer 252. The contact layer supports the metal electrodes 212–214 and 222–225 that form a non-alloyed contact with the contact layer. Of the electrodes 212–214 and 222–225, only the electrodes 212, 213 and 223 are shown in FIG. 5. The electrodes may be composed of layers of titanium, platinum and gold with a total thickness of 300 nm. Many alternative electrode materials are known in the art and include Ti/W, W/Si, Mo/Au, Pd/Au and Ti/Pd/Au. The cap layer 252 and the contact layer 254 reduce the contact resistance between the graded-composition layer 250 and the electrodes 212–214 and 222–225. This reduction in the contact resistance is achieved without performing any heat treatment, such as annealing. This method and structure for reducing contact resistance are based on the method of manufacturing heterojunction transistors (HBT) described by F. Ren et al. in 28 Electron. Lett., 1150 (1992).

The PCS 200 is fabricated by successively growing the layers 204, 206, 207, 208, 250, 252 and 254 and then depositing a Ti/Pt/Au electrode layer in which the electrodes 212–214 and 222–225 will be defined. The electrode layer is then patterned to define the individual electrodes. The semiconductor materials of the graded-composition layer 250, the cap layer 252 and the contact layer 254 between the electrodes are then etched away. The etch stops at the top confinement layer 208. The electrodes may be used as an etch mask that defines the portions of the layers 250, 252 and 254 that are not etched away.

Finally, the silicon nitride (Si$_3$N$_4$) anti-reflection coating 256 is deposited on the top surface of the PCS 100, including the electrodes 212–214 and 222–225 and the exposed surface of the top confinement layer 208. The thickness of the anti-reflection coating is 100 nm. The anti-reflection coating prevents or reduces reflection of the incident light that would otherwise occur due to the large difference in refractive index between the AlGaAs of the top confinement layer 208 and the ambient, such as air.

The PCS 200 is switched ON by illuminating it with a beam of incident light generated by a semiconductor laser. The wavelength of the incident light is chosen to be one at which the energy per photon is below the band edge of the WB material of the confinement layer through which the incident light reaches the photo-conductive layer 206, i.e., the top confinement layer 208 in this example, to minimize absorption by the confinement layer. The wavelength of the incident light is also chosen to be one at which the energy per photon is above the band edge of the NB material of the photo-conductive layer 206 to maximize absorption of the incident light by the photo-conductive layer. In the example just described, the incident light had a wavelength of about 0.78 μm. The beam of incident light has a substantially-circular cross section about 30 μm in diameter. A commercially-available semiconductor laser can be used to generate the incident light 142 so that the miniature PCS 200 can be manufactured at low cost.

Figure 6:
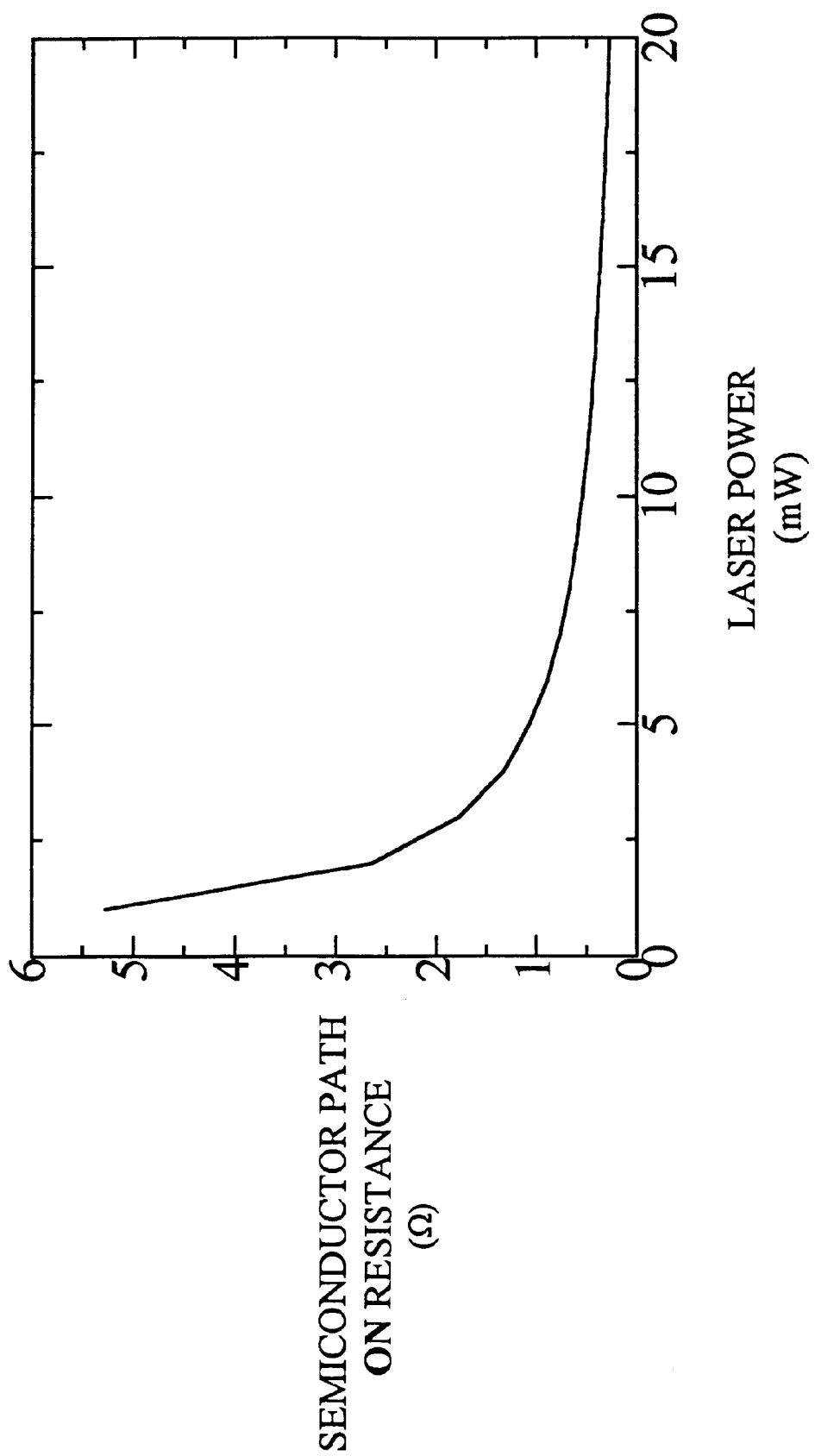
FIG. 6 is a graph showing the variation of the semiconductor path ON resistance $R_{s(on)}$ with the power of the laser generating the incident light in the embodiment of the PCS shown in FIG. 5. The semiconductor path ON resistance is the ON resistance of the conductive path through the top confinement layer and the photo-conductive layer of the double heterojunction PCS structure.

The characteristics of the beam of incident light 142, the physical properties of GaAs and such device parameters as the optical absorption coefficient of the photo-conductive layer 206 $\alpha_P$=9,000 cm$^{-1}$, the carrier lifetime τ=10 ns, the carrier mobility μ=6,300 cm$^2$/Vs, the electrode width w=3 μm and the inter-electrode spacing v=2 μm were used to calculate the semiconductor path ON resistance R$_{s(on)}$ of the PCS 200. The semiconductor path ON resistance is the resistance of the conduction path through the top confinement layer 208 and the photo-conductive layer 206 when the PCS 200 is illuminated by the incident light. FIG. 6 is a graph showing of the variation of the semiconductor path ON resistance with the power of the laser that generates the incident light. In this exemplary embodiment, the thickness d of the photo-conductive layer 206 is at least 1.7 μm, which is greater than the absorption length $\alpha_P^{-1}$=1.1 μm.

Test samples having the characteristics just described were fabricated. The test samples were illuminated with incident light generated by a 5 mW laser and measurements of their ON resistance were made. The ON resistance R$_{on}$ measured between the terminals 110 and 120 was in the range of three to five ohms. However, it was determined that an abnormally high contact resistance R$_c$ between the terminals 110 and 120 and the top confinement layer 208 accounted for most of the ON resistance. Additional measurements showed that the semiconductor path ON resistance R$_{s(on)}$ was about one ohm. It is anticipated that the contact resistance R$_c$ of additional samples currently in fabrication will be less than the semiconductor path ON resistance R$_{s(on)}$. Such samples will have an ON resistance that is acceptable for use as a microwave switch.

The overall conversion efficiency of the PCS 200 is $\eta = \eta_c \times \eta_s \times \eta_r \times \eta_a \times \eta_i = 95\% \times 60\% \times 99\% \times 75\% \times 95\% = 40\%$, where $\eta_c$=95%, $\eta_s$=60%, $\eta_r$=99%, $\eta_a$=75% and $\eta_i$=95%. The two main elements that lower the conversion efficiency η are $\eta_s$, the electrode transmission factor, and $\eta_a$, the absorptance of the photo-conductive layer 106. The low value of the electrode transmission factor $\eta_s$ indicates that the electrodes 212–214 and 222–225 prevent a substantial fraction of the incident light from reaching the photo-conductive layer 206. The absorptance $\eta_a$ of the photo-conductive layer 206 having a low value indicates that a substantial fraction of the incident light that reaches the photo-conductive layer passes through the photo-conductive layer without being absorbed.

Figure 7:
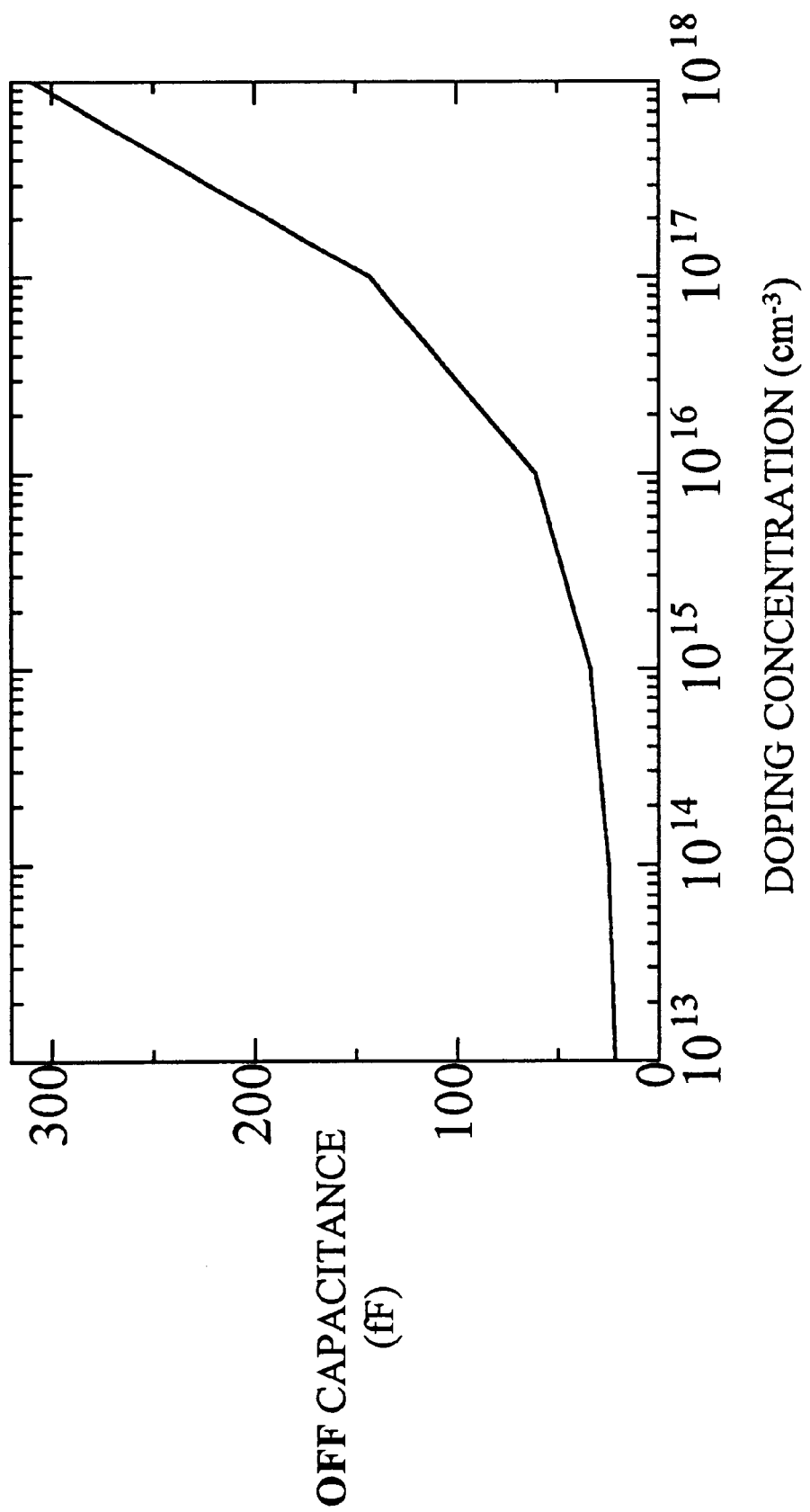
FIG. 7 is a graph showing the variation of the OFF capacitance $C_{off}$ with the dopant concentration in the photo-conductive layer in the embodiment of the PCS shown in FIG. 5.

The main element of the OFF capacitance $C_{off}$ of the PCS 200 is the capacitance of the depletion layer between the photo-conductive layer 206 and the top confinement layer 208, and depends on the doping concentration in the photo-conductive layer. FIG. 7 shows the OFF capacitance plotted against the doping concentration of the photo-conductive layer. The OFF capacitance $C_{off}$ increases as the doping concentration increases, so a lower doping concentration reduces the OFF capacitance $C_{off}$.

However, an excessive reduction in the doping concentration causes an excessive increase in the thickness of the depletion layers. This reduces the punch-through voltage of the PCS 200. If the amplitude of the signal being switched by the PCS exceeds the punch-through voltage, the impedance of the PCS falls to a small value, and the PCS no longer provides isolation in its OFF state. Moreover, with current crystal growth technology, it is difficult to control the doping concentration at low doping levels. Consequently, it is preferred that the doping concentration of the photo-conductive layer be in the range from $1\times10^{15}$ cm$^{-3}$ to $1\times10^{17}$ cm$^{-3}$. Doping concentrations in this range provide an acceptable trade-off between the OFF capacitance $C_{off}$ and the punch-through voltage. Reducing the area of the electrodes 212–214 and 222–225 also reduces the OFF capacitance $C_{off}$. As noted above, in embodiments of the PCS for use in systems with a characteristic impedance of 50Ω, the OFF capacitance $C_{off}$ needs to be no smaller than that which has a reactance at the frequency f of the signal being switched that is large compared with 50Ω, i.e., $1/2\pi f \cdot C_{off} >> 50\Omega$.

Figure 5:
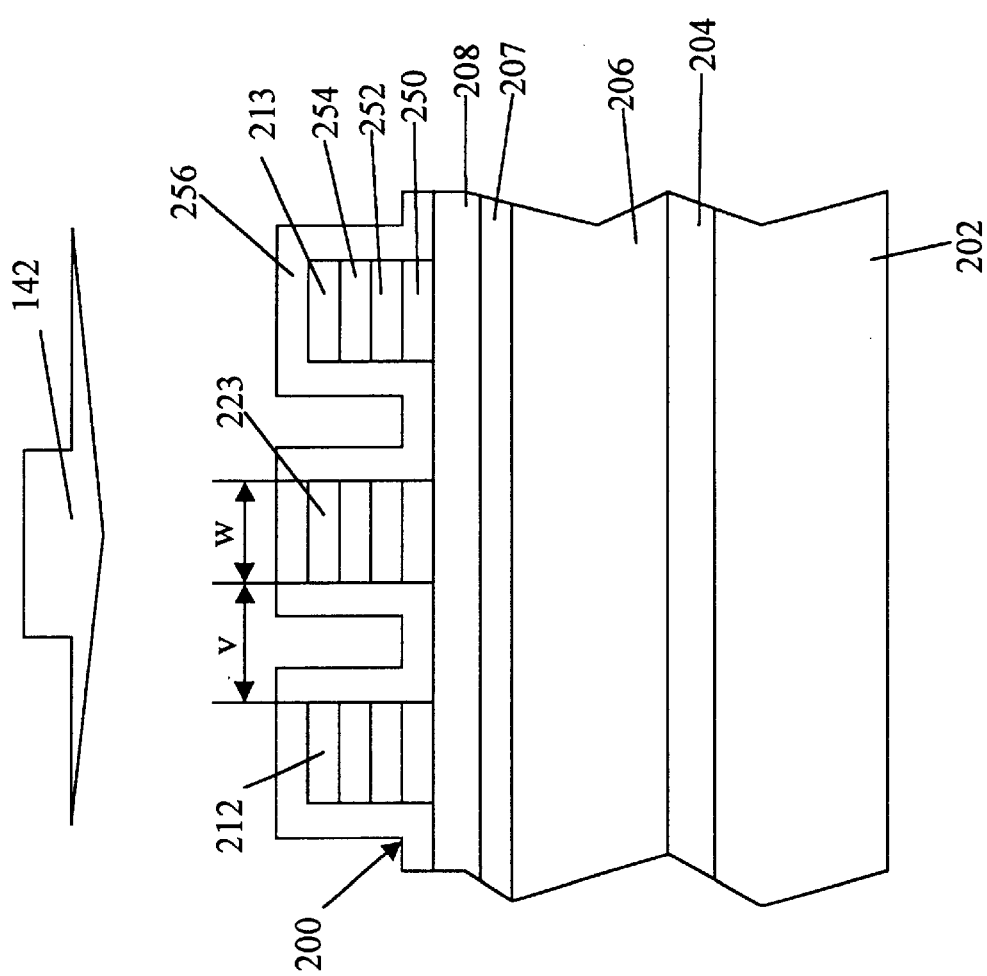
FIG. 5 is a cross-sectional view of part of a second embodiment of a PCS according to the invention in its conducting state.

The PCS 200 depicted in FIG. 5 has an OFF capacitance $C_{off}$ of 60 fF, and a figure of merit $R_{on} \times C_{off}$ of 0.06 ΩpF. This is smaller, and therefore better, than that of conventional high-frequency switches.

Figure 8:
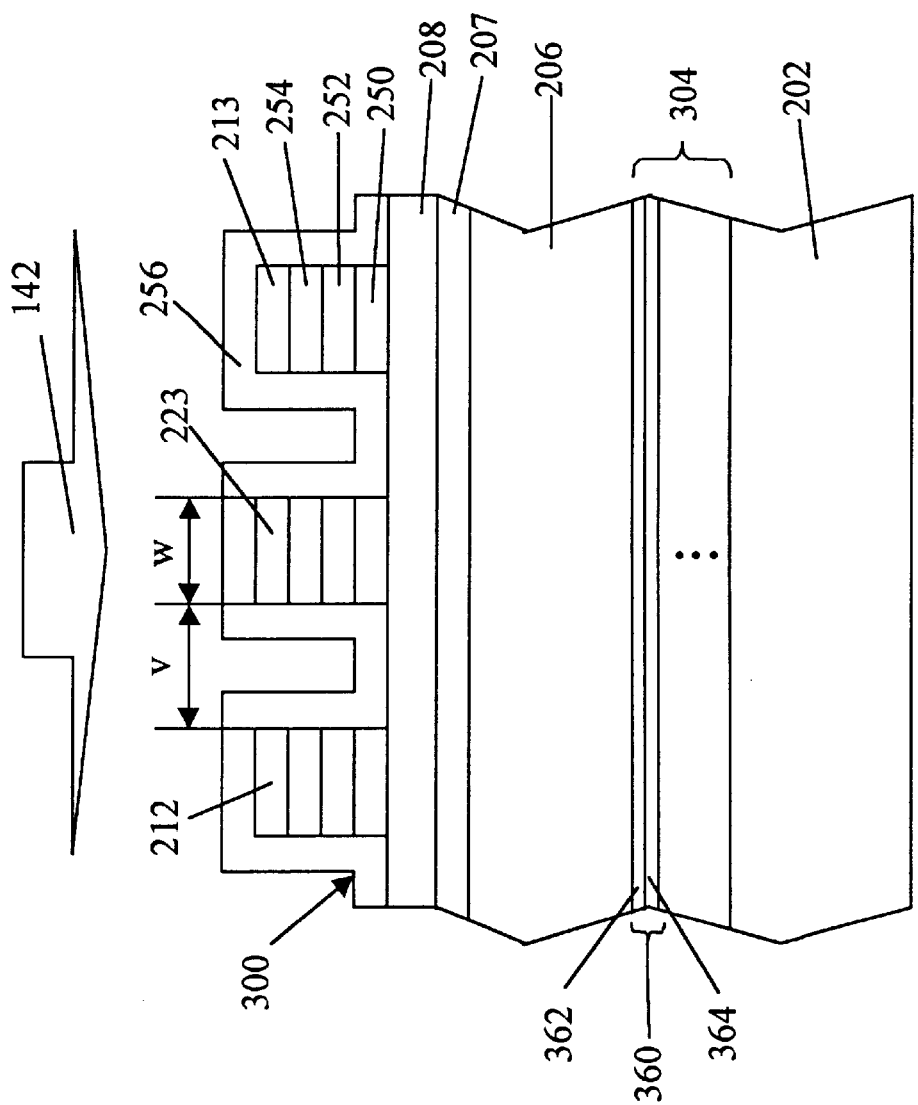
FIG. 8 is a cross-sectional view of part of a third embodiment of a PCS according to the invention in its conducting state.

FIG. 8 shows a third embodiment 300 of a PCS according to the invention in which the conversion efficiency is further increased. The structure of the PCS 300 is similar to that of the PCS 200 shown in FIG. 5. Elements of the PCS 300 that correspond to elements of the PCS 200 are indicated by the same reference numerals and will not be described again here. As noted above, the main factors that lower the overall conversion efficiency q of the PCS 200 are $\eta_s$, the electrode transmission factor, and $\eta_a$, the absorptance of the photo-conductive layer 106. In the PCS 300, the bottom confinement layer is structured as the mirror layer 304. The mirror layer effectively increases the absorptance $\eta_a$ of the photo-conductive layer by reflecting the portion of the incident light that passes through the photo-conductive layer 206 without being absorbed back into the photo-conductive layer.

In the example shown, the mirror layer 304 is a distributed Bragg reflector composed of multiple pairs of sub-layers of semiconductor material. An exemplary pair of sub-layers is shown at 360. The pair of sub-layers 360 is composed of the 64 nm-thick $Al_{0.3}Ga_{0.7}As$ sub layer 362 and the 73 nm-thick AlAs sub layer 364. The thickness $t_m$ of each sub-layer is equal to an integral odd multiple of one-fourth of the wavelength λ of the incident light 142 in the material of the sub-layer, i.e., $t_m = m\lambda/4n$, where:

m is an odd integer,

λ is the wavelength of the incident light 142 in free space, and n is the refractive index of the material of the sub-layer at the wavelength λ.

In one practical embodiment of the PCS 300, the materials of the sub-layers constituting the mirror layer 304 were doped n-type, the mirror layer was composed of 10 pairs of sub-layers, and the reflectivity of the mirror layer was about 90%. The reflectivity of the bottom confinement layer 204 of the PCS 200 is about 0.08%.

The mirror layer 304 effectively increases the absorptance $\eta_a$ of the photo-conductive layer 206 to 98% in the PCS 300, compared with 60% in the PCS 200. This increases the overall conversion efficiency η to 66%, and reduces the semiconductor path ON resistance $R_{s(On)}$ to two-thirds of that of the PCS 200.

As noted above, the main factors that lower the overall conversion efficiency η of the PCS 200 are $\eta_s$, the electrode transmission factor, and $\eta_a$, the absorptance of the photo-conductive layer 206. The electrode transmission factor is usually equal to the fraction of the light reception area 140 (FIG. 2) not covered by the electrodes 212–214 and 222–225 because the electrodes are conventionally opaque and reflective. The electrodes absorb or reflect the fraction of the incident light 142 that falls on them, which prevents this fraction of the incident light from passing through the top confinement layer 208 to the photo-conductive layer 206. The electrode transmission factor can be increased to close to 100%, and the conversion efficiency of the PCS can be increased yet further, by configuring the PCS according to the invention so that the electrodes prevent little, if any, of the incident light from reaching the photo-conductive layer.

For example, the PCS 300 shown in FIG. 8 can be configured so that the electrodes 212–214 and 222–225 (of which only 212, 223 and 213 are shown) prevent only a small fraction of the incident light 142 from reaching the photo-conductive layer 206 by fabricating the electrodes from a translucent material. A number of suitable conductive translucent materials are known in the art and include, for example, indium-tin oxide (ITO) and a thin layer of silver.

Alternatively, the PCS can be configured so that its electrodes prevent none of the incident light from passing to the photo-conductive layer. This is done by configuring the PCS so that the incident light reaches the photo-conductive layer through the bottom confinement layer, where there are no electrodes to absorb or reflect the incident light.

Figure 9:
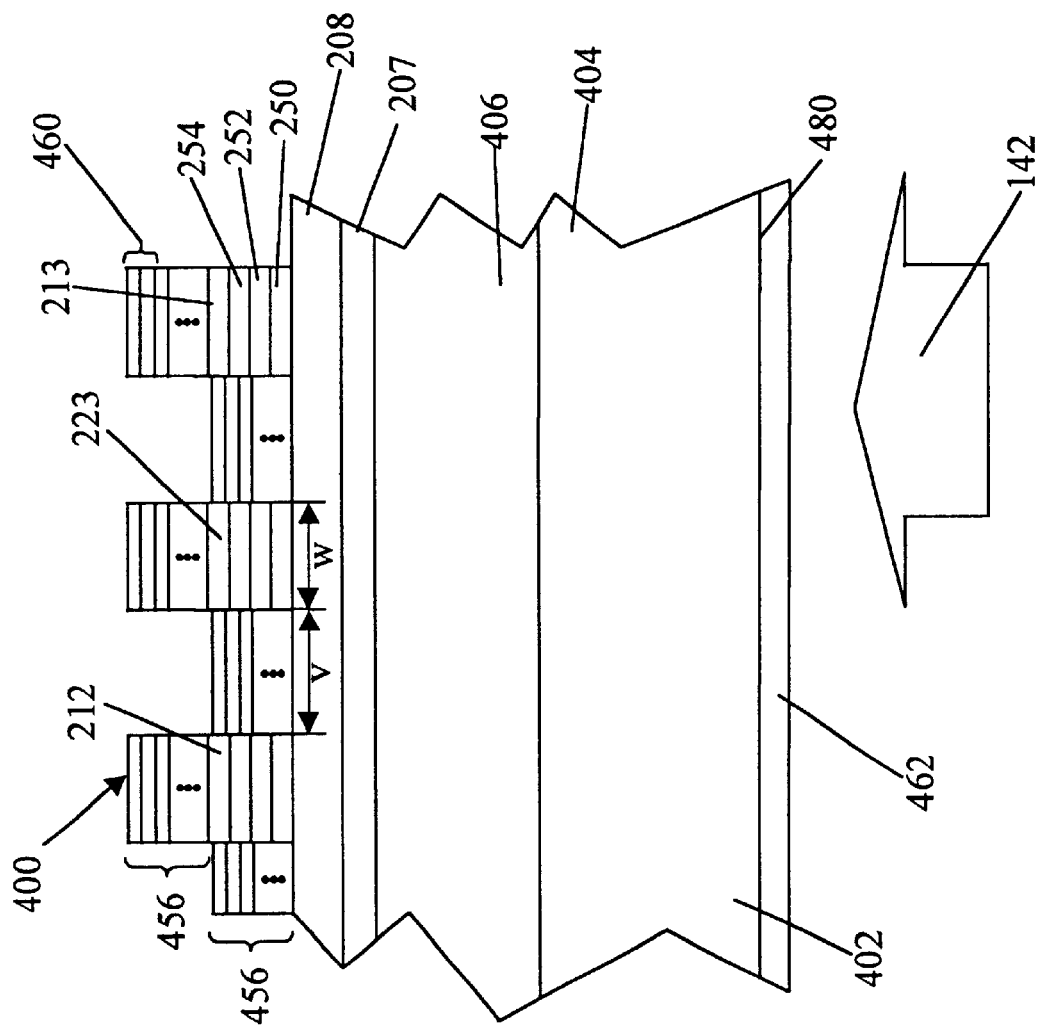
FIG. 9 is a cross-sectional view of part of a fourth embodiment of a PCS according to the invention in its conducting state.

FIG. 9 shows a fourth embodiment 400 of a PCS according to the invention in which the conversion efficiency is increased yet further. The structure of the PCS 400 is similar to that of the PCS 200 shown in FIG. 5. Elements of the PCS 400 that correspond to elements of the PCS 200 are indicated by the same reference numerals and will not be described again here. The overall conversion efficiency η of the PCS 400 is increased by both increasing the electrode transmission factor $\eta_s$ and by effectively increasing the absorptance $\eta_a$ of the photo-conductive layer.

In the PCS 400, the substrate 402 is a wafer of a material that is translucent in the range of wavelengths of the incident light 142 that are absorbed by the photo-conductive layer 406. This enables the PCS 400 to receive the incident light through the substrate where there are no electrodes to absorb or reflect part the incident light. This increases the electrode transmission factor $\eta_s$ to close to 100%. Also, the PCS 400 includes the mirror layer 456 located over the surface of the PCS remote from the substrate. The mirror layer effectively increases the absorptance $\eta_a$ of the photo-conductive layer 406 by reflecting the incident light that passes through the photo-conductive layer without being absorbed back into the photo-conductive layer.

In the example shown, the substrate 402 is a wafer of InP, the photo-conductive layer 406 is a layer of InGaAs and the top confinement layer 408 is a layer of $(Al_xGa_{1-x})_{0.5}In_{0.5}As$. The substrate material is a WB material, so the bottom confinement layer 404 is integral with the substrate in the example shown. Moreover, as noted above, the substrate material is translucent in the range of wavelengths of the incident light 142 that are absorbed by the photo-conductive layer 406. Other materials may be used as the substrate 402, the photo-conductive layer 406 and the top confinement layer 408. Moreover, the bottom confinement layer 404 may be a separate layer of WB material deposited or grown on the substrate 402 instead of being integral with the substrate.

The surface 480 of the substrate remote from the electrodes, of which only the electrodes 212, 213 and 223 are shown, is coated with the anti-reflection coating 462, a 100 nm-thick layer of silicon nitride ($Si_3N_4$), to reduce reflection of the incident light 142 by the surface 480 of the substrate.

The PCS 400 is mounted in a way that allows the incident light to illuminate the surface 480 of the substrate 402. For example, flip-chip bonding techniques may be used to mount the PCS on a suitable header (not shown) with the substrate oriented to receive the incident light 142 from the laser or LED that generates the incident light. The incident light passes through the substrate to reach the photo-conductive layer 406. Since there are no electrodes located in the path of the incident light, the electrode transmission factor $\eta_s$ is close to 100%.

The PCS 400 is fabricated by first forming a structure substantially similar to that of the PCS 200. However, different materials are used for the substrate 402, the confinement layers 404 and 408 and the photo-conductive layer 406, as described above. Also, the $Si_3N_4$ anti-reflection coating 256 is omitted and the mirror layer 456 is instead located on the surface of the PCS remote from the substrate 402. In this example, the mirror layer 456 is a distributed Bragg reflector composed of multiple pairs of sub-layers of dielectric materials. An exemplary pair of sub-layers is shown at 460. The pair of sub-layers 460 is composed of a 147 nm-thick layer of $SiO_2$ and a 99 nm-thick layer of $TiO_2$. These thicknesses correspond to one-fourth of the wavelength of the incident light 142 in the respective materials, as described above. Due to the large difference in refractive index between the $SiO_2$ and $TiO_2$ of the sub-layers (1.45 for $SiO_2$ and 2.15 for $TiO_2$), only three pair of sub-layers are required to provide a reflectivity of about 90%. Such a reflectivity increases the effective absorptance $\eta_a$ of the photo-conductive layer 406 to about 98%. After the mirror layer has been deposited, the part of the mirror layer 456 that overlies the bonding pads 111 and 121 (FIG. 2) is etched off. Finally, the anti-reflection coating 462, a 100 nm-thick layer of silicon nitride ($Si_3N_4$), is deposited on the surface 480 of the substrate.

The overall conversion efficiency of the PCS 400 is predicted to be $\eta=\eta_c \times \eta_s \times \eta_r \times \eta_a \times \eta_i \times 95\% \times 100\% \times 99\% \times 98\% \times 95\% = 88\%$. The improvement in the overall conversion efficiency $\eta$ results in a semiconductor path ON resistance $R_{s(on)}$ of about one-half of that of the PCS 200. Similar results are predicted for an embodiment based on the PCS 300 shown in FIG. 8 in which the electrodes 212–214 and 222–225 are fabricated from a translucent electrode material indium tin oxide (ITO) instead of a conventional opaque electrode material.

Figure 10:
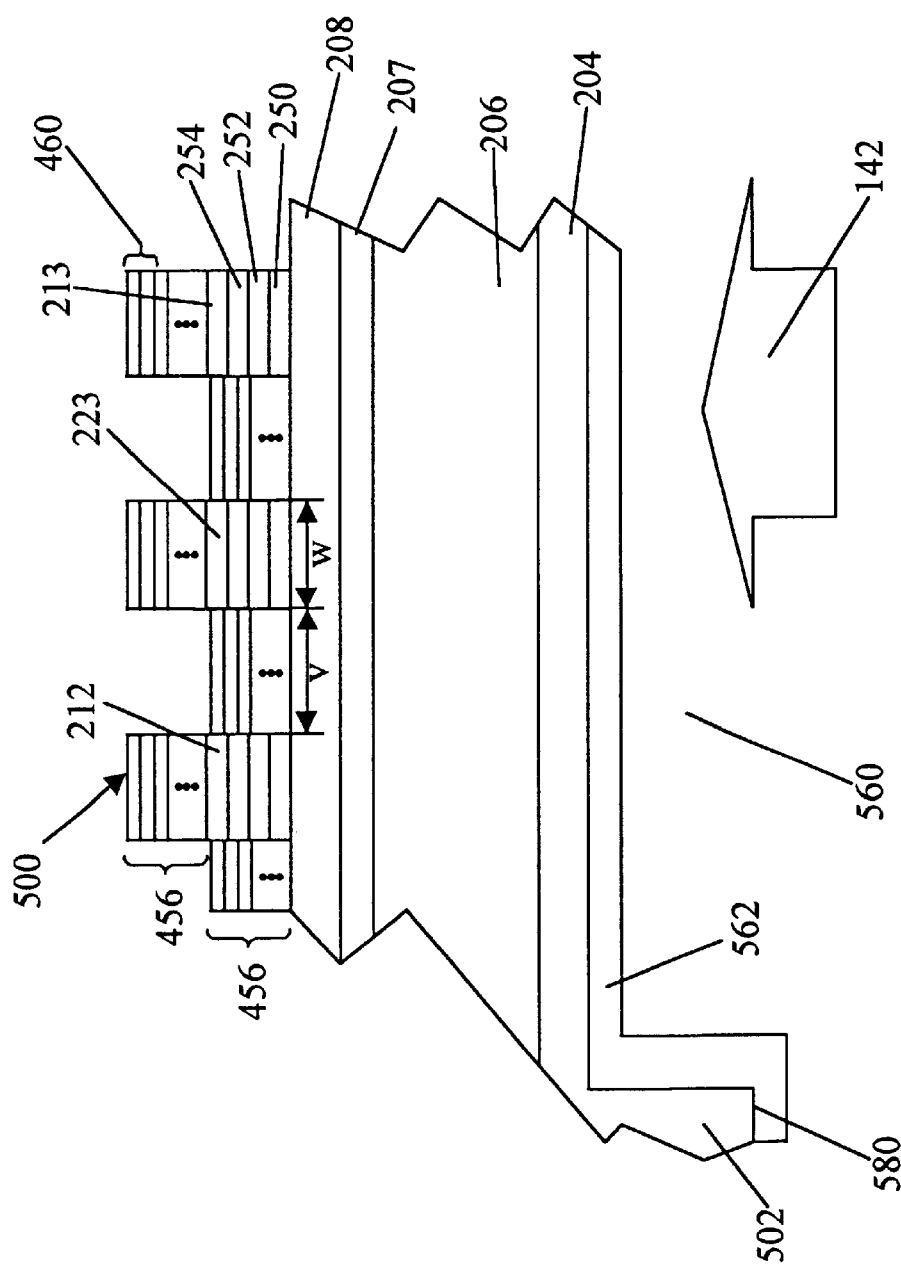
FIG. 10 is a cross-sectional view of part of a fifth embodiment of a PCS according to the invention in its conducting state.

FIG. 10 shows a fifth embodiment 500 of a PCS according to the invention in which the overall conversion efficiency $\eta$ is similar to that of the PCS 400 just described. Elements of the PCS 500 that correspond to elements of the PCSs 200 and 400 described above are indicated by the same reference numerals and will not be described again here. As in the PCS 400, the overall conversion efficiency $\eta$ of the PCS 500 is increased by both increasing the electrode transmission factor $\eta_s$ and by effectively increasing the absorptance $\eta_a$ of the photo-conductive layer. The PCS 500 includes the through hole 560 etched through the thickness of the substrate 502 to allow the incident light to illuminate the bottom confinement layer 204, and to pass through the bottom confinement layer to reach the photo-conductive layer 206. Since there are no electrodes located in the path of the incident light, this increases the electrode transmission factor $\eta_s$ to close to 100% while enabling the material of the substrate to be opaque in the range of wavelengths of the incident light that are absorbed by the photo-conductive layer. The PCS 500 also includes the mirror layer 456 over the surface of the PCS remote from the substrate 502, which effectively increases the absorptance $\eta_a$ of the photo-conductive layer 206, as described above.

In the example shown, the substrate 502 is a wafer of GaAs, the photo-conductive layer 206 is a layer of $Al_xGa_{1-x}As$ and the confinement layers 204 and 208 are layers of $Al_yGa_{1-y}As$, where x<y. The substrate material is absorbent in the range of wavelengths of the incident light 142 that are absorbed by the photo-conductive layer. The substrate material is also absorbent in the range of wavelengths of the incident light that are absorbed by the photo-conductive layer in other combinations of materials from which the PCS may be fabricated. It is also beneficial to etch the through hole 560 through the thickness of the substrate even in embodiments of the PCS in which the substrate material is nominally translucent in the range of wavelengths of the incident light that are absorbed by the photo-conductive layer, since the through-hole reduces absorption of the incident light that would otherwise occur as a result of the incident light passing through the thickness of the substrate.

Etching the through-hole 560 presents the problem of controlling the etch process so that the through-hole extends through the entire thickness of the substrate 502 but does not remove all or part of the bottom confinement layer 204. This is especially difficult because the thickness of the bottom confinement layer is very small compared with the thickness of the substrate (less than 0.1 $\mu$m compared with more than one hundred $\mu$m). The inventors have solved this problem by using a material for the bottom confinement layer that is etched by a given echant at a substantially slower rate than the material of the substrate. This enables the bottom confinement layer to act as an etch stop for the etching process. For example, when the material of the substrate is GaAs, the bottom confinement layer 204 may be a layer of AlGaAs, which serves as an effective etch stop when etching GaAs. This method for forming the through-hole 560 is based on the method described by H. Tanobe et al. in 31 Jpn. J. Appl. Phys., 1597 (1992) for fabricating a surface-emitting laser, and will not be described in further detail here.

The PCS 500 is fabricated by a method based on that described above for fabricating the PCS 400, except that the materials of the substrate 502, the photo-conductive layer 206 and top confinement layer 208 are different. Also, in the example shown, a separate layer of WB material is deposited on the substrate to form the bottom confinement layer 204, as in the PCS 200. After the mirror layer 456 has been deposited, and the part of the mirror layer that overlies the bonding pads 111 and 121 (FIG. 2) has been etched off, the surface 580 of the substrate 502 remote from the mirror layer 456 is masked by a layer of photoresist except for the area in which the through-hole 560 is to be located. The PCS is then etched using a chemical etchant that etches GaAs at a considerably faster rate than AlGaAs. Etchants of the ammonium system are known in the art that provide an etch rate ratio of more than 10:1. One example of such an etchant is a mixture of hydrogen peroxide and ammonium hydroxide. Using such an etchant enables the bottom confinement layer 204 to act as an etch stop when the through-hole is etched.

After the etching the through-hole 560 in the substrate 502, the anti-reflection coating 562, a 100 nm-thick layer of silicon nitride ($Si_3N_4$), is deposited on the surface 580 of the substrate, on the side-walls of the though-hole and on the exposed surface of the bottom confinement layer 204.

The overall conversion efficiency of the PCS 500 is $\eta=\eta_c\times\eta_s\times\eta_r\times\eta_a\times\eta_i=95\%\times100\%\times99\%\times98\%\times95\%=88\%$. The improvement in the overall conversion efficiency $\eta$ results in a semiconductor path ON resistance $R_{s(on)}$ of about one-half of that of the PCS 200.

Although this disclosure describes illustrative embodiments of the invention in detail, it is to be understood that the invention is not limited to the precise embodiments described, and that various modifications may be practiced within the scope of the invention defined by the appended claims.

We claim:

1. A photo-conductive switch, comprising:
   a first confinement layer of a first semiconductor material having a first band-gap energy and a first conductivity type;
   a second confinement layer of a second semiconductor material having a second band-gap energy;
   a photo-conductive layer of a third semiconductor material having a third band-gap energy and a second conductivity type, opposite to the first conductivity type, the photo-conductive layer being sandwiched between the first confinement layer and the second confinement layer, the third band-gap energy being less than the first and second band-gap energies; and
   a first electrode and a second electrode separate from each other and located on a surface of the first confinement layer remote from the photo-conductive layer, in which:
   illuminating a portion of the photo-conductive layer with incident light increases conduction through the photo-conductive layer between the first electrode and the second electrode.

2. The photo-conductive switch of claim 1, in which the first band gap energy and the second band-gap energy are at least 25 meV greater than the third band-gap energy.

3. The photo-conductive switch of claim 1, additionally comprising a layer including one of (a) a graded composition and (b) a chirped super lattice multi-layered film, the layer being sandwiched between the photo-conductive layer and the first confinement layer.

4. The photo-conductive switch of claim 1, in which the first semiconductor material is $Al_yGa_{1-y}As$, where $0.02<y<1.0$, and the third semiconductor material is $Al_xGa_{1-x}As$, where $x<y$.

5. The photo-conductive switch of claim 1, in which:
   the photo-conductive switch additionally comprises a light source positioned to illuminate the photo-conductive layer with the incident light;
   the first confinement layer and the photo-conductive layer respectively have a thickness of $t_c$ and d;
   the first semiconductor material and the third semiconductor material respectively have an absorption coefficient of $\alpha_c$ and $\alpha_P$ with respect to the incident light;
   a product $t_c\alpha_c$ of the thickness of the first confinement layer and the absorption coefficient of the first semiconductor material has a value that is small compared with unity; and
   a product $d\alpha_P$ of the thickness of the photo-conductive layer and the absorption coefficient of the third semiconductor material has a value greater than about unity.

6. The photo-conductive switch of claim 1, in which a combination of (a) the first semiconductor material, and (b) the third semiconductor material is selected from a group consisting of:
   $(Al_yGa_{1-y})_{0.5}In_{0.5}P$, where $0.0\leq y\leq 1.0$, and $Al_xGa_{1-x}As$ where $0.0\leq x<0.5$;
   $Al_yGa_{1-y}As$, where $0.0<y<1.0$, and $In_xGa_{1-x}As$, where $0.01<x<0.3$;
   $(Al_xGa_{1-x})_{0.5}In_{0.5}As$, where $0.01<x<1.0$, and $In_{0.5}Ga_{0.5}As$;
   $(Al_xGa_{1-x})_{0.5}In_{0.5}As$, where $0.01<x<1.0$, and $GaAs_{0.5}Sb_{0.5}$;
   $Al_xGa_{1-x}N$, where $0.01<x<1.0$, and GaN;
   Si and $Ge_xSi_{1-x}$, where $0.05<x<1.0$;
   Si and SiC;
   $Zn_yMg_{1-y}S_zSe_{1-z}$, where $0<y<1.0$ and $0<z<1.0$, and $ZnS_xSe_{1-x}$, where $0<x<1$;
   $Al_xGa_{1-x}Sb$, where $0.01<x<1.0$, and GaSb; and
   $Pb_xCd_{1-x}Te$, where $0.01<x<1.0$, and PbTe.

7. The photo-conductive switch of claim 1, in which the first conductivity type is n-type.

8. The photo-conductive switch of claim 7, in which the first semiconductor material is more highly doped than the third semiconductor material.

9. The photo-conductive switch of claim 8, in which third semiconductor material has a doping concentration less than $1\times10^{17}cm^{-3}$.

10. The photo-conductive switch of claim 1, additionally comprising an anti-reflection coating on a surface of one of the confinement layers.

11. The photo-conductive switch of claim 1, in which the second confinement layer includes a mirror layer.

12. The photo-conductive switch of claim 11, in which the mirror layer includes a pair of layers of materials having different refractive indices.

13. The photo-conductive switch of claim 1, in which:
   the photo-conductive switch additionally comprises a substrate supporting the second confinement layer; and
   the substrate defines a through-hole exposing part of the second confinement layer.

14. The photo-conductive switch of claim 13, additionally comprising an anti-reflection coating on a surface of the second confinement layer exposed by the through-hole.

15. The photo-conductive switch of claim 13, additionally comprising a mirror layer on a surface of the first confinement layer.

16. The photo-conductive switch of claim 1, in which the electrodes include a translucent conductive material.

17. The photo-conductive switch of claim 1, in which:
   the photo-conductive switch additionally comprises a substrate of a material that is translucent in a range of wavelengths of the incident light that is absorbed by the photo-conductive layer; and
   the substrate supports the photo-conductive layer and the first confinement layer.

18. The photo-conductive switch of claim 1, in which:
   the photo-conductive switch additionally comprises a substrate; and
   the second confinement layer is integral with the substrate.

19. The photo-conductive switch of claim 18, in which the substrate includes a material that is translucent in a range of wavelengths of the incident light that is absorbed by the photo-conductive layer.

20. A photo-conductive switch, comprising:
- a first confinement layer of a first semiconductor material having a first band-gap energy and a first conductivity type;
- a mirror layer including a pair of sub-layers of semiconductor materials having different refractive indices and respective band-gap energies;
- a photo-conductive layer of a third semiconductor material having a third band-gap energy and a second conductivity type, opposite to the first conductivity type, the photo-conductive layer being sandwiched between the first confinement layer and the mirror layer, the third band-gap energy being less than the first band-gap energy and the band-gap energies of the semiconductor materials of the mirror layer;
- a first electrode and a second electrode separate from each other and located on a surface of the first confinement layer remote from the photo-conductive layer; and
- an anti-reflective coating adjacent at least part of the first confinement layer.

21. The photo-conductive switch of claim 20, in which:
- the photo-conductive switch additionally comprises a light source positioned to illuminate the photo-conductive layer with incident light;
- the first confinement layer and the photo-conductive layer respectively have a thickness of $t_c$ and d;
- the first semiconductor material and the third semiconductor material respectively have an absorption coefficient of $\alpha_c$ and $\alpha_P$ with respect to the incident light;
- a product $t_c\alpha_c$ of the thickness of the first confinement layer and the absorption coefficient of the first semiconductor material has a value that is small compared with unity; and
- a product $d\alpha_P$ of the thickness of the photo-conductive layer and the absorption coefficient of the third semiconductor material has a value greater than about unity.

22. A photo-conductive switch, comprising:
- a substrate having a through-hole defined therein;
- a first confinement layer of a first semiconductor material having a first band-gap energy and a first conductivity type;
- a second confinement layer of a second semiconductor material having a second band-gap energy, the second confinement layer being adjacent the substrate and substantially covering the through-hole;
- a photo-conductive layer of a third semiconductor material having a third band-gap energy and a second conductivity type, opposite to the first conductivity type, the photo-conductive layer being sandwiched between the first confinement layer and the second confinement layer, the third band-gap energy being less than the first band-gap energy and the second band-gap energy;
- a first electrode and a second electrode separate from each other and located on a surface of the first confinement layer remote from the photo-conductive layer; and
- a mirror layer adjacent the first confinement layer.

23. The photo-conductive switch of claim 22, in which:
- the photo-conductive switch additionally comprises a light source positioned to illuminate the photo-conductive layer with incident light;
- the first confinement layer and the photo-conductive layer respectively have a thickness of $t_c$ and d;
- the first semiconductor material and the third semiconductor material respectively have an absorption coefficient of $\alpha_c$ and $\alpha_P$ with respect to the incident light;
- a product $t_c\alpha_c$ of the thickness of the first confinement layer and the absorption coefficient of the first semiconductor material has a value that is small compared with unity; and
- a product $d\alpha_P$ of the thickness of the photo-conductive layer and the absorption coefficient of the third semiconductor material has a value greater than about unity.

24. The photo-conductive switch of claim 22, in which the mirror layer includes a pair of sub-layers of dielectric materials having different refractive indices.

* * * * *